US009532486B1

(12) United States Patent
Hinkle et al.

(10) Patent No.: US 9,532,486 B1
(45) Date of Patent: Dec. 27, 2016

(54) CARD EDGE CONNECTOR WITH HEAT SPREADER PLATE

(71) Applicant: Lenovo Enterprise Solutions (Singapore) Pte. Ltd., Singapore (SG)

(72) Inventors: Jonathan Randall Hinkle, Morrisville, NC (US); Jason A. Matteson, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/836,845

(22) Filed: Aug. 26, 2015

(51) Int. Cl.
*H01R 13/502* (2006.01)
*H05K 7/20* (2006.01)
*H01R 12/72* (2011.01)

(52) U.S. Cl.
CPC ........ *H05K 7/20409* (2013.01); *H01R 12/721* (2013.01)

(58) Field of Classification Search
CPC . H01R 13/6587; H01R 13/511; H01R 23/688; H01R 13/502; F21V 29/004
USPC ............................................ 439/607.07, 487
See application file for complete search history.

(56) References Cited

U.S. PATENT DOCUMENTS

| 8,605,439 | B2* | 12/2013 | Li | G11B 33/025 361/704 |
| 8,721,359 | B1* | 5/2014 | Tate | H01R 12/58 439/487 |
| 2002/0168898 | A1* | 11/2002 | Billman | H01R 13/514 439/607.07 |
| 2014/0349514 | A1* | 11/2014 | Yang | H01R 13/6581 439/487 |

* cited by examiner

*Primary Examiner* — Gary Paumen
(74) *Attorney, Agent, or Firm* — Zilka-Kotab, PC

(57) ABSTRACT

In one general embodiment, a system includes a first end having a plurality of first contacts configured for coupling with a circuit device, and a second end having a plurality of second contacts configured for coupling directly with a card edge of an electronic device. The system also includes a plurality of leads extending between the first and second contacts. A heat spreader plate extends along the leads between the first and second ends, the heat spreader plate having at least one of: a conducting pad extending beyond the first end and a conducting pad extending beyond the second end.

20 Claims, 9 Drawing Sheets

CARD EDGE CONNECTOR WITH HEAT SPREADER PLATE

FIELD OF THE INVENTION

The present invention relates to electrical connectors, and more particularly, this invention relates to heat dissipation on and/or around card-to-circuit device electrical connectors.

BACKGROUND

Conventional card edge connection layouts may include condensed designs that dedicate very little space for thermal heat transfer. Additionally, vertical backplane connection layouts may be perpendicular to the airflow through the card environment, e.g., such as a high performance card in a computer, etc., which may be disruptive to normal functionality e.g. due to overheating, etc. Moreover, conventional condensed card edge connectors frequently do not have adequate room to include heat displacement technologies. Because lowering the performance of conventional card edge connectors is not an acceptable solution for cooling the connectors, conventional cards and/or the card connectors may overheat, which may eventually lead to expensive connectivity losses and/or performance losses.

SUMMARY

A system according to one embodiment includes a first end having a plurality of first contacts configured for coupling with a circuit device, and a second end having a plurality of second contacts configured for coupling directly with a card edge of an electronic device. The system also includes a plurality of leads extending between the first and second contacts. A heat spreader plate extends along the leads between the first and second ends, the heat spreader plate having at least one of: a conducting pad extending beyond the first end and a conducting pad extending beyond the second end.

A system according to another embodiment includes a first end having a plurality of first contacts configured for coupling with a circuit device, and a second end having a plurality of second contacts configured for coupling directly with a card edge of an electronic device. A plurality of leads extend between the first and second contacts. A heat spreader plate extends along the leads between the first and second ends, the heat spreader plate having a conducting pad having an orthogonal elbow defining a portion of the conducting pad extending generally orthogonally from a body of the heat spreader.

A system according to yet another embodiment includes a first end having a plurality of first contacts configured for coupling with a circuit device, and a second end having a plurality of second contacts configured for coupling directly with a card edge of an electronic device. A plurality of leads extend between the first and second contacts. A sidewall extends between the first and second ends and lying in a plane extending along the leads. A heat spreader plate extends along the leads between the first and second ends, the heat spreader plate having a conducting pad extending beyond the sidewall.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

Figure 1:
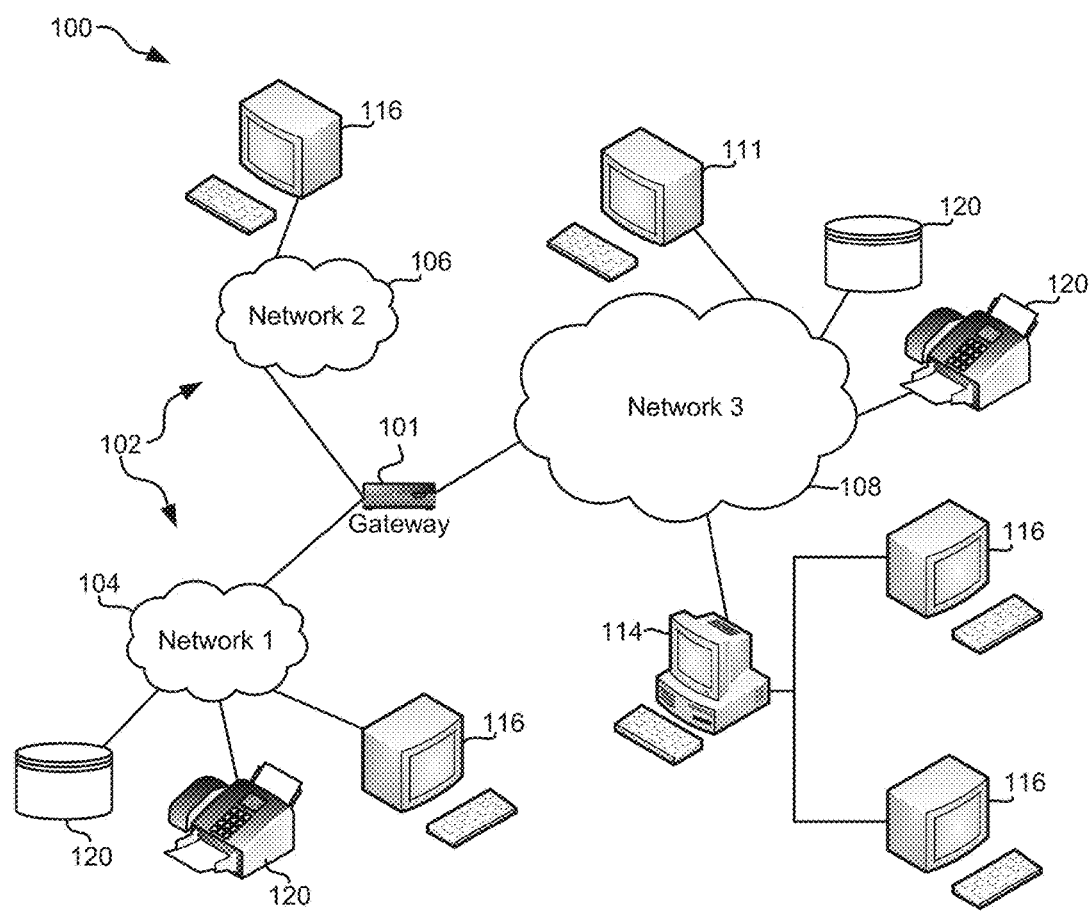
FIG. 1 is a network architecture, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of heat spreading and/or dissipation on and/or around card-to-circuit device electrical connectors and/or related systems and methods. Various embodiments described herein establish advantageous card edge connection layouts with heat spreaders while maintaining a condensed and temperature balanced card environment.

In one general embodiment, a system includes a first end having a plurality of first contacts configured for coupling with a circuit device, and a second end having a plurality of second contacts configured for coupling directly with a card edge of an electronic device. The system also includes a plurality of leads extending between the first and second contacts. A heat spreader plate extends along the leads between the first and second ends, the heat spreader plate having at least one of: a conducting pad extending beyond the first end and a conducting pad extending beyond the second end.

In another general embodiment, a system includes a first end having a plurality of first contacts configured for coupling with a circuit device, and a second end having a plurality of second contacts configured for coupling directly with a card edge of an electronic device. A plurality of leads extend between the first and second contacts. A heat spreader plate extends along the leads between the first and second ends, the heat spreader plate having a conducting pad having an orthogonal elbow defining a portion of the conducting pad extending generally orthogonally from a body of the heat spreader.

In yet another general embodiment, a system includes a first end having a plurality of first contacts configured for coupling with a circuit device, and a second end having a plurality of second contacts configured for coupling directly with a card edge of an electronic device. A plurality of leads extend between the first and second contacts. A sidewall extends between the first and second ends and lying in a plane extending along the leads. A heat spreader plate extends along the leads between the first and second ends, the heat spreader plate having a conducting pad extending beyond the sidewall.

The description herein is presented to enable any person skilled in the art to make and use the invention and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

In particular, various embodiments of the invention discussed herein are implemented using the Internet as a means of communicating among a plurality of computer systems. One skilled in the art will recognize that the present invention is not limited to the use of the Internet as a communication medium and that alternative methods of the invention may accommodate the use of a private intranet, a Local Area Network (LAN), a Wide Area Network (WAN) or other means of communication. In addition, various combinations of wired, wireless (e.g., radio frequency) and optical communication links may be utilized.

The program environment in which one embodiment of the invention may be executed illustratively incorporates one or more general-purpose computers or special-purpose devices such hand-held computers. Details of such devices (e.g., processor, memory, data storage, input and output devices) are well known and are omitted for the sake of clarity.

It should also be understood that the techniques of the present invention might be implemented using a variety of technologies. For example, the methods described herein may be implemented in software running on a computer system, or implemented in hardware utilizing one or more processors and logic (hardware and/or software) for performing operations of the method, application specific integrated circuits, programmable logic devices such as Field Programmable Gate Arrays (FPGAs), and/or various combinations thereof. In one illustrative approach, methods described herein may be implemented by a series of computer-executable instructions residing on a storage medium such as a physical (e.g., non-transitory) computer-readable medium. In addition, although specific embodiments of the invention may employ object-oriented software programming concepts, the invention is not so limited and is easily adapted to employ other forms of directing the operation of a computer.

The invention can also be provided in the form of a computer program product comprising a computer readable storage or signal medium having computer code thereon, which may be executed by a computing device (e.g., a processor) and/or system. A computer readable storage medium can include any medium capable of storing computer code thereon for use by a computing device or system, including optical media such as read only and writeable CD and DVD, magnetic memory or medium (e.g., hard disk drive, tape), semiconductor memory (e.g., FLASH memory and other portable memory cards, etc.), firmware encoded in a chip, etc.

A computer readable signal medium is one that does not fit within the aforementioned storage medium class. For example, illustrative computer readable signal media communicate or otherwise transfer transitory signals within a system, between systems e.g., via a physical or virtual network, etc.

FIG. 1 illustrates an architecture 100, in accordance with one embodiment. As an option, the present architecture 100 may be implemented in conjunction with features from any other embodiment listed herein, such as those described with reference to the other FIGS. Of course, however, such architecture 100 and others presented herein may be used in various applications and/or in permutations which may or may not be specifically described in the illustrative embodiments listed herein. Further, the architecture 100 presented herein may be used in any desired environment.

As shown in FIG. 1, a plurality of remote networks 102 are provided including a first remote network 104 and a second remote network 106. A gateway 101 may be coupled between the remote networks 102 and a proximate network 108. In the context of the present network architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. Such user devices 116 may include a desktop computer, laptop computer, hand-held computer, printer or any other type of logic. It should be noted that a user device 111 may also be directly coupled to any of the networks, in one embodiment.

A peripheral 120 or series of peripherals 120, e.g. facsimile machines, printers, networked storage units, etc., may be coupled to one or more of the networks 104, 106, 108. It should be noted that databases, servers, and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates a MAC OS environment, a UNIX system which virtually hosts a MICROSOFT WINDOWS environment, a MICROSOFT WINDOWS system which emulates a MAC OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data processing and/or storage, servers, etc., are provided to any system in the cloud, preferably in an on-demand relationship, thereby allowing access and distribution of services across many computing systems. Cloud computing typically involves an Internet or other high speed connection (e.g., 4G LTE, fiber optic, etc.) between the systems operating in the cloud, but other techniques of connecting the systems may also be used.

Figure 2:
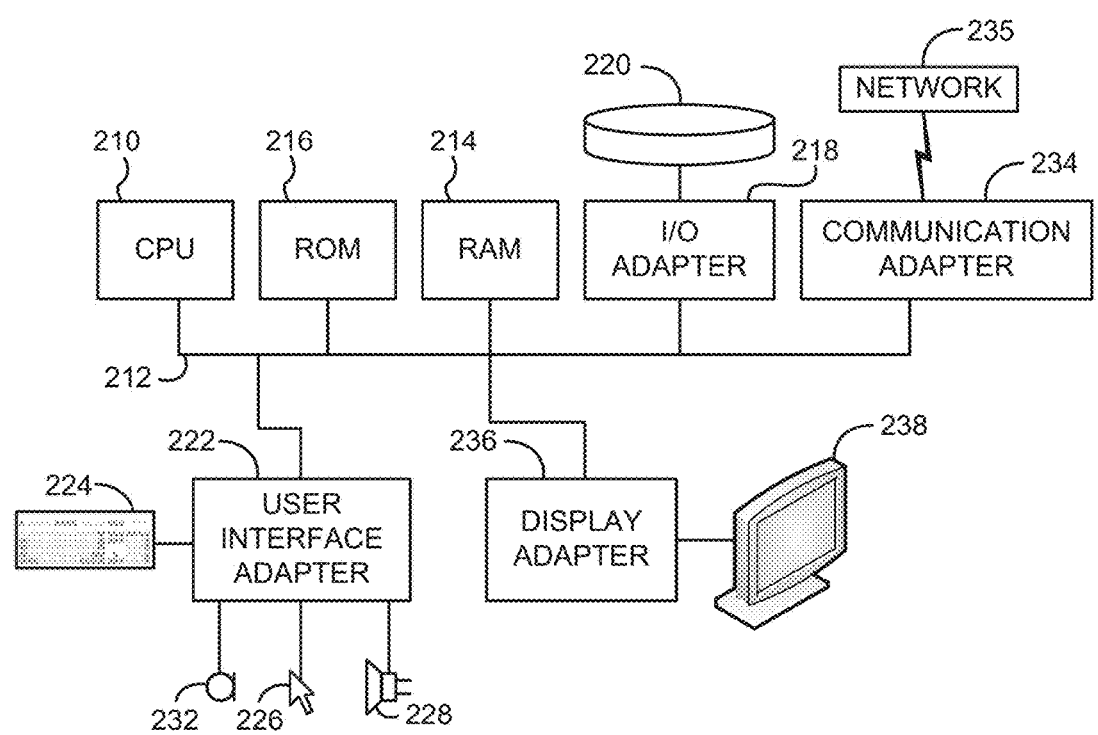
FIG. 2 shows a representative hardware environment that may be associated with the servers and/or clients of FIG. 1.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an I/O adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Card edge connector environments may become overcrowded due to the high density layouts of circuit devices to which the card edge connectors are coupled. This overcrowding may lead to overheating of the card edge connector environments, and furthermore, a lack of ease e.g. in terms of insertion angles, in terms of ease of accessibly, etc., when hot swapping cards in the card edge connectors. Embodiments described herein include card edge connection layouts with heat spreading capabilities for maintaining a condensed and temperature-balanced card environment.

FIGS. 3A-3D depicts a connector 300 with a heat spreader in accordance with one embodiment. As an option, the present connector 300 may be implemented in conjunction with features from any other embodiment listed herein, such as those described with reference to the other FIGS. Of course, however, such connector 300 and others presented herein may be used in various applications and/or in permutations which may or may not be specifically described in the illustrative embodiments listed herein. Further, the connector 300 presented herein may be used in any desired environment.

Various embodiments may include one or a plurality of connectors 300. Each connector 300 has a first end 314 having a plurality of first contacts 304 configured for coupling with a circuit device, which may be any type of device having a circuit, such as a circuit board, another connector (including a cable), etc. Embodiments with a circuit board are shown in later FIGS. The first contacts 304 may be copper and/or a conductive contact material of a type known in the art.

Each connector 300 additionally may have a second end 316 oriented about orthogonal to the first end 314. The second end 316 has a plurality of second contacts 308 configured for coupling directly with a card edge of an electronic device (embodiments with electronic devices shown in later FIGS.). Similar to the first contacts 304, the second contacts 308 may be copper, gold and/or a conductive contact material of a type known in the art.

Connector 300 also includes a plurality of leads 326 extending between, e.g., connecting, the first contacts 304 and the second contacts 308.

The leads 326 connecting the first contacts 304 to the second contacts 308 may be copper, gold, aluminum, and/or a conductive contact material of a type known in the art.

Connector 300 additionally includes a heat spreader plate 302 extending along the leads 326 between the first and second ends 314, 316. The heat spreader plate 302 may include a thermally conductive material of a type known in the art, e.g., aluminum, copper, a thermally conductive material with nickel plating, etc. The heat spreader plate 302 may thermally spread and/or diffuse heat present on the connector 300, to a cooler location, e.g., such as a heat sink and/or circuit board (as will later be described in greater detail) and thereby prevent the connector 300 and/or the system environment around the card from overheating. This may be advantageous, because overheating the connector, card and/or connector environment may stress the connector 300 and/or the card, which may eventually lead to expensive malfunctioning of the card and/or connector, connectivity losses and/or performance losses. The heat spreader plate 302 may be coupled to other components of the connector 300 by a coupling process known in the art, e.g., contact soldering, a mechanical retention tab, an adhesive, etc.

The heat spreader plate 302 may assist in transferring heat away from other portions of the connector and/or an electronic device coupled to the connector. For example, the heat spreader plate 302 may transfer heat away from the leads 326 of the connector, thereby allowing the leads to absorb more heat from an electronic device coupled thereto. Moreover, the heat spreader plate 302 may conduct heat from an electronic device directly, as described in more detail below. Further, the heat spreader plate 302 may engage a heat sink to further enhance heat transfer.

According to various embodiments, at least one side of the heat spreader plate 302 facing the leads 326 may be electrically insulating. In one approach, the side of the heat spreader plate 302 facing the leads 326 may include an electrically insulating coating. In another approach, the entire heat spreader plate 302 may be an insulating material.

Any insulating material known in the art may be used in such approaches, such as a metal oxide, an electrically nonconductive phase change material, etc., with those materials having higher thermal conductivity being preferred. Accordingly, the heat spreader plate 302 may be in direct contact with the leads 326, thereby maximizing conduction of heat from the leads without creating an electrical short between the leads 326.

In some embodiments, the heat spreader plate 302 may face and be spaced from exposed sides of the leads 326, on an opposite side thereof as the substrate of the connector upon which the leads lie. The space between the heat spreader plate 302 and the exposed sides of the leads 326 may include, e.g., an air gap, an insulating layer with good thermal conductivity, thermal conduction-promoting grease, etc.

According to various embodiments, portions of all the leads 326 may extend along a common plane. Having portions of all the leads extending along a common plane may further ensure that connector 300 remains spatially compact e.g. to increase component density, etc.

According to other embodiments, portions of some leads 326 may extend along a common substrate and/or plane in connector 300, while portions of some of the leads 326 may extend along a second substrate and/or plane in connector 300. According to yet other embodiments, portions of all of the leads 326 may extend along different substrates and/or planes in connector 300.

Figure 3A:
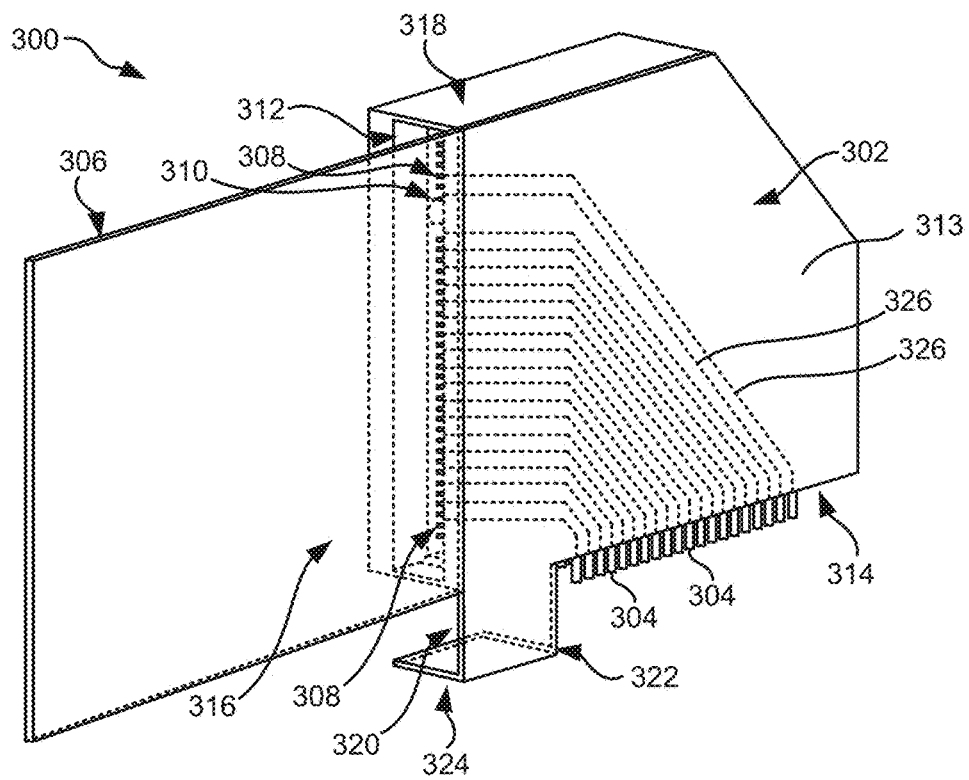
FIG. 3A is a perspective view of a connector with a heat spreader, in accordance with one embodiment.

As heat is spread and/or accumulates on the heat spreader plate 302, the heat spreader plate may preferably spread the heat to an area away from the connector. The heat spreader plate 302 may have at least one of a conducting pad 320 extending beyond the first end 314 and a conducting pad 306 extending beyond the second end 316. In the example of FIG. 3A, the heat spreader plate 302 extends beyond both ends 314, 316 of the connector. The conducting pad 320 extending beyond the first end 314 may serve as a conducting thermal pathway for transferring heat from the heat spreader plate 302 to an area away from the connector 300, e.g. an area beyond the first end 314. The conducting pad 320 may thermally bus heat to an area, e.g., such as a heat sink, the circuit board, a base pan, etc. (e.g. see FIG. 4), away from the connector 300. Thermally bussing heat to an area away from the connector 300 may preserve connector space for performance components, rather than having to sacrifice connector 300 space with thermal cooling components such as a bulky heat sink.

The conducting pad 306 extending beyond the second end 316 may serve as a conducting thermal pathway for transferring heat from an electronic component that may be coupled to the second end 316 of the connector to the connector itself and/or an area away from the connector 300, e.g. an area beyond the first end 314. In one approach, the conducting pad 306 may be configured to physically engage an electronic component coupled to the second end 316. The conducting pad 306 physically engaging an electronic component coupled to the second end 316 may promote thermal dissipation of heat from the electronic component to the conducting pad 306 (e.g. see FIG. 9A-9B). The physical engagement may include direct physical contact, but may also include an intervening material such as a grease, etc. that creates a thermal conduction path.

According to further embodiments, an electronics card may include a conducting pad that contacts the heat spreader plate 302, when the electronics card is coupled with the second end 316.

It should be noted that although connector 300 includes one conducting pad 306 that may be configured to physically engage an electronic component coupled to the second end 316, according to further embodiments, the connector 300 may include a second conducting pad that may be configured to physically engage a different portion, e.g., a different side of the electronic component, of an electronic component coupled to the second end 316 than the conducting pad 306 physically engages.

It should also be noted that although connector 300 includes a single conducting pad 320 extending beyond the first end 314, as well as a single heat spreader plate 302, further embodiments should not be limited thereto. For example, in embodiments described herein, multiple sides of the connectors described herein may have heat spreader components of any type described herein and/or in any combination.

The conducting pad may include an orthogonal elbow 322 defining a portion 324 of the conducting pad 320 extending generally orthogonally from a body of the heat spreader plate 302 in an area beyond the first end 314. The portion 324 of the conducting pad 320 may provide a greater contact surface area for dissipating heat into a material, e.g., a heat sink, a material that is exposed to airflow that passes by connector 300, a heat dissipater of a type known in the art, etc., that contacts the portion 324 and thereby lowers the temperature of the connector 300.

Figure 3B:
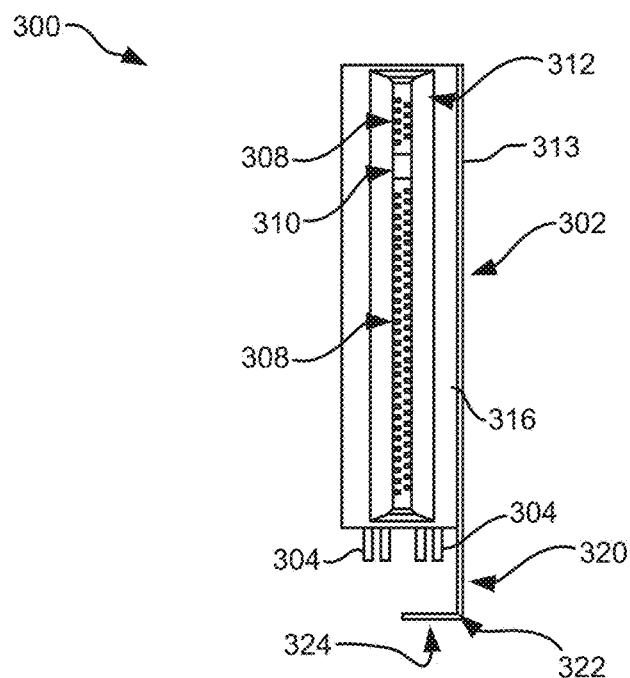
FIG. 3B is a front view of the connector of FIG. 3A, in accordance with one embodiment.

It should be noted that although the spatial parameters, e.g., the width of the portion 324, appear to match that of the conducting pad 320 extending beyond the first end 314, the spatial and/or angular parameters of the portion 324 may vary depending on the embodiment. For example, according to further embodiments, the portion 324 may extend generally orthogonally from the body 313 of the heat spreader plate 302 in an area away from the second end 316. In general, the body 313 of the heat spreader plate 302 may be the largest portion thereof, and/or the portion extending along the leads of the connector. Equivalently, the portion 324 may extend generally orthogonally from the plane of the body 313 of the heat spreader plate 302. In FIG. 3B, the plane of the body 313 of the heat spreader 302 extends vertically and out of the page of the drawing.

It should be noted that the heat spreader plate 302 and/or the conducting pads 320, 306 may be a thermal conducting material of a type known in the art. Furthermore, the heat spreader plate 302 and/or the conducting pads 320, 306 may vary from one another in material, depending on the embodiment.

Connector 300 may further include at least one ground plane (not shown) extending generally parallel to the leads 326. The number of ground planes included in each connector 300 may vary depending on the preferred embodiment. Each of the one or more ground pins of the ground planes may be of a same and/or different design, e.g., shape, orientation therewith, etc., as the first contacts 304. Furthermore, the ground plane preferably does not disrupt heat from transferring from the connector 300 components, e.g., leads 326, inner portions of the connector 300, any portion of the connector 300 that may diffuse heat to the spreader plate 302, etc., to the spreader plate 302. Designing one or more ground pins of the ground planes to be substantially similar to the design of the first contacts 304 may advantageously ensure a spatially compact connector 300.

The plurality of leads 326 connecting the first contacts 304 to the second contacts 308 may reside on an inner portion of connector 300, e.g. that is enclosed by a housing 318, etc. The housing 318 may preferably be an injected molded plastic housing, but according to other embodiments may be e.g., a cast aluminum housing, a composite housing, of a conventional housing material of a type known in the art, etc. Furthermore the housing 318 may be configured in a way that prevents functionality problems in connector 300 e.g. electrical shorting, electrical isolation, system thermal irregularities, etc.

With continued reference to FIGS. 3A-3D, connector 300 may additionally include shielding, e.g., backplanes, reference planes for signal quality measures, etc., within the connector 300. Such shielding may furthermore extend into a circuit device (embodiments with a circuit board shown in later FIGS.) to which the connector 300 may be electrically coupled.

The second end 316 may also include an alignment feature 310 dividing the second contacts 308 into multiple arrays. The multiple arrays may divide contacts into the same and/or different size arrays of second contacts 308. Additionally, the multiple arrays may divide contacts of differing size and/or contact type e.g., in order to separate data contacts from power contacts, in order to separate differing data contact types, in order to establish an easier pairing of the second contacts 308 with a pairing contact, etc. For example, in connector 300 the alignment feature 310 divides the second contacts 308 into two separate arrays, each of which are of differing array sizes.

The alignment feature 310 may furthermore be configured to be received in a slot and/or indent of a card edge that is configured to be paired with the second end 316. For example, the alignment feature may be received in a slot and/or indent of a card edge that is paired with the second end 316, and may furthermore help to retain the card in the second end due to the alignment feature being substantially fit e.g. snuggly fit, abrasively fit, etc. within the slot and/or indent of a card edge.

According to other embodiments, the second end 316 may include a divider that divides the second contacts 308 into multiple identical arrays. In another embodiment, the divider may divide the second contacts 308 into multiple differing arrays. In yet another embodiment, the divider may divide the second contacts 308 into one or more differing arrays as well as one or more identical arrays.

In another embodiment, the alignment feature 310 may include one or more dividers (not shown) that separate the second contacts 308 into arrays each coupleable to a unique electronic device. The arrays separated by the one or more dividers may be of different and/or the same size. Furthermore, the one or more contacts of each array may differ in configuration and/or have identical contact configurations. In one exemplary approach, the connector may have two of the arrays of second contacts 308 like the array shown in FIG. 3A or another type, but stacked one atop the other, or side by side, for coupling with two unique electronic devices.

With continued reference to connector 300, the second end 316 includes an elongated slot 312 configured to receive the card edge of an electronic device. According to various embodiments, the elongated slot 312 may include an alignment portion, e.g., a partially angled portion which may assist in guiding the card edge of the electronic device as the card edge of the electronic device is inserted, an insertion guidance rail, e.g. as the second contacts are coupled directly with the card edge of an electronic device, etc., into the elongated slot 312, etc. Illustrative alignment portions are shown in FIG. 3B at the top and bottom of slot 312.

FIG. 3B is a front view of the connector 300. As shown in FIG. 3B, according to various embodiments the second contacts 308 may be positioned along both sides, e.g., the right side and left side, of the elongated slot 312. However, in other approaches, the second contacts 308 may be present along only a single side, or in any other arrangement as would become apparent to one skilled in the art upon reading the present disclosure. In further embodiments, the second contacts 308 may be pins, e.g., similar to the first contacts 304 shown in the FIG. 3A.

It should be noted that an edge of the conducting pad 306 is shown in FIG. 3B, but because of the visual front view perspective of connector 300, the majority of the conducting pad 306 is not visible, and is therefore not labeled for purposes of simplification. Additionally, the portion 324 of the conducting pad 320 is shown to extend to about the middle of the first contacts 304, but the spatial parameters of the portion 324 may vary depending on the embodiment. For example, according to further embodiments, the portion 324 may be enlarged to create a greater surface area for diffusing heat from the heat spreader plate 302 into a heat sink (see FIG. 4).

Figure 3C:
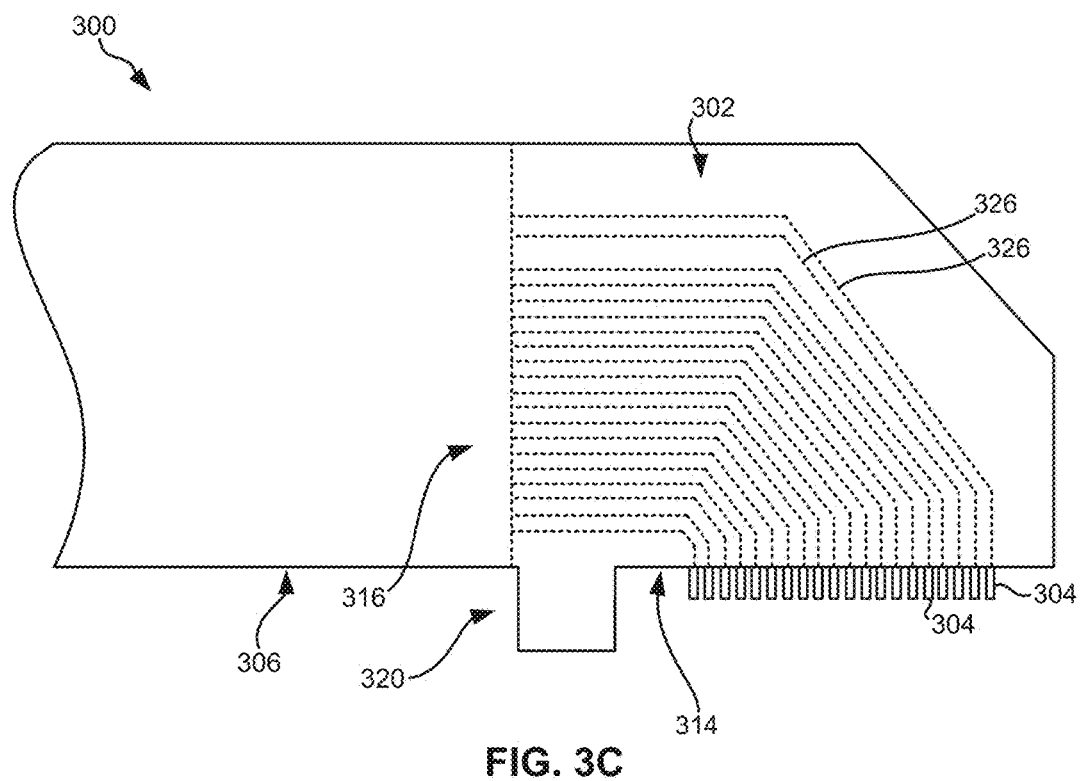
FIG. 3C is a side view of the connector of FIG. 3A-3B, in accordance with one embodiment.

FIG. 3C is a side view of the connector 300.

Figure 3D:
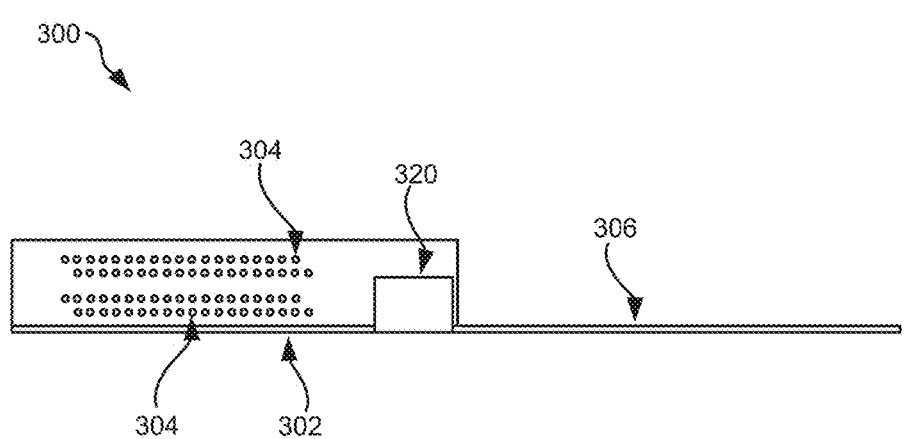
FIG. 3D is a bottom view of the connector of FIG. 3A-3C, in accordance with one embodiment.

FIG. 3D is a bottom view of the connector 300. In this exemplary embodiment, the first contacts 304 of the first end 314 are configured in two separate side by side arrays which may include signal and/or ground contacts. The configuration of the first contacts 304 of the first end 314 may furthermore vary depending on the spatial parameters of a component the connector 300 may be electrically coupled to, e.g., a circuit device, an option board, etc., via contacts 304. Moreover, the first contacts 304 may be present in a slot, e.g., similar to slot 312.

According to various embodiments, the connector 300 may have an aspect ratio of at least 1:2 (width:height), more preferably at least 1:4, as measured along the first end, e.g., as shown in FIG. 3B and/or the second end, e.g., as shown in FIG. 3D.

Figure 4:
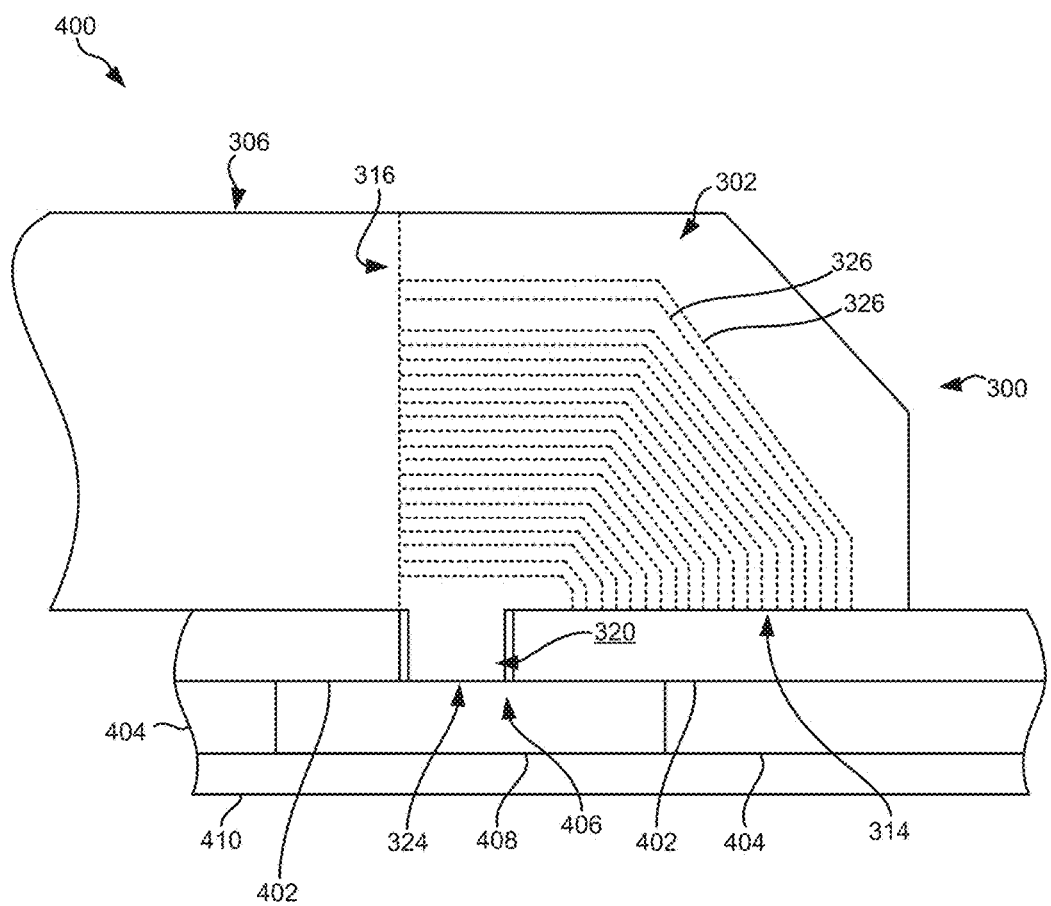
FIG. 4 is a side view of a connector with a heat spreader, and a circuit device, in accordance with one embodiment.

FIG. 4 depicts a system 400 in accordance with one embodiment. As an option, the present system 400 may be implemented in conjunction with features from any other embodiment listed herein, such as those described with reference to the other FIGS. Of course, however, such system 400 and others presented herein may be used in various applications and/or in permutations which may or may not be specifically described in the illustrative embodiments listed herein. Further, the system 400 presented herein may be used in any desired environment.

System 400 includes the connector 300 electrically coupled to a circuit device, in this example, a circuit board 402. The electrical coupling between the connector 300 and the circuit board 402 may be established via the first contacts (not shown in FIG. 4) of the connectors 300.

According to various embodiments, the circuit device may be a motherboard, mainboard, backplane circuit board, printed circuit board (PCB), etc. According to other embodiments, the circuit device may be an option board cabled to a motherboard. The circuit device may include conventional features, e.g. circuits, chips, etc., and in some cases having specialized contact arrays for coupling to the first contacts 304 of the connectors 300.

As previously described, the first end 314 of a connector 300 has a plurality of first contacts 304 coupled to the circuit board 402, thereby establishing an electrical connection between the connector 300 and the circuit board 402, etc.

Various embodiments of coupling the first contacts 304 to the circuit board 402 will now be described below for purposes of an example. Further coupling embodiments may be alternatively and/or additionally used to couple one or more connectors 300 and the circuit board 402.

According to various embodiments, the first contacts 304 may be coupled to the circuit board 402 by a solder tail coupling e.g. as shown in system 400, etc. Solder tail coupling may be established between the first contacts 304 and the circuit board 402 by soldering, e.g., wave soldering, a soldering of a type known in the art, etc., the first contacts 304 of connector 300 to drilled through holes in the circuit board 402.

According to further embodiments, the first contacts 304 may be coupled to the circuit board 402 by a press fit coupling. Press fit coupling may be established between the first contacts 304 and the circuit board 402 by pressing oversized first contacts 304 of the first end 314 partially and/or fully into plated holes in the circuit board 402. Press fit coupling may advantageously establish a reliable connection between the connector 300 and the circuit board 402, e.g., by the press fitting establishing an air tight seal between the connector 300 and the circuit board 402, by using an oversized first contact that by design compresses as it is inserted into a plated hole of the circuit board 402, etc. It should be noted that the press fit coupling described herein may or may not additionally include a soldering between the oversized first contacts 304 of the first end 314 and the plated holes in the circuit board 402. Press fit coupling may furthermore eliminate reflection stub that otherwise may reduce signal integrity or signal quality established by the coupling.

According to yet further embodiments, the first contacts 304 may be coupled to the circuit board 402 by a surface mount coupling (hereafter referred to as "SMT"). According to various embodiments, SMT coupling may be established between the first contacts 304 and the circuit board 402 by pressing first contacts 304 into surface pads on circuit board 402. The surface pads may include solder paste which may then may then couple the first contacts 304 with the circuit board 402 once the solder paste is melted e.g. via infrared reflow, via a heating of the solder paste, via a soldering type known in the art, etc. The first contacts 304 may furthermore be "L" shaped in order to establish an orthogonal coupling between the second contacts 308 and the first contacts 304 (the first contacts 304 being coupled with the circuit board 402 at the surface pads, etc.). SMT coupling may provide stronger signal integrity and/or performance, and therefore may be preferred.

According to one embodiment, the connectors 300 may be coupled to the circuit board 402 on a recessed/lowered portion (not shown) of the circuit board 402, so that the connector profile on the circuit board 402 is low profile and/or flush with the surface of the circuit board 402 to which the connector 300 is coupled.

It should be noted that in embodiments which include more than one connector 300 being coupled to the circuit board 402, the type of coupling may vary depending on the preferred embodiment. Alternatively in embodiments which include more than one connector 300 being coupled to the circuit board 402, the type of coupling may be the same.

The conducting pad 320 may include a portion 324 extending generally orthogonally from the body of the heat spreader plate 302 (into and/or out of the page in FIG. 4). Furthermore, the portion 324 extending generally orthogonally from the body of the heat spreader plate 302 may be in direct thermal communication with the circuit board 402. The direct thermal communication between the portion extending generally orthogonally from the body of the heat spreader plate 302 and the circuit board 402 may conduct heat from the body of the heat spreader plate 302 to the circuit board 402. For example, heat conducted from one or more components of the connector 300 to the body of the heat spreader plate 302 may be conducted to the circuit board 402 via the direct thermal communication between the conducting pad 320 and the circuit board 402.

In some approaches, the portion of the conducting pad 320 extending generally orthogonally from the body of the heat spreader plate 302 may furthermore be about coextensive with the first end 314 to engage the planar circuit board 402 and conduct heat thereto.

Conducting heat from the body of the heat spreader plate 302 to the circuit board 402 may prevent the connector 300 and/or a system, e.g., system 400, which includes the connector 300 from overheating and or losing functionality due to temperature stress.

The direct thermal communication (between the portion extending generally orthogonally from the body of the heat spreader plate 302 and the circuit board 402) may include an intervening layer, but may not include an air gap. For example, the intervening layer may include, e.g., grease, a thermal conducting material of a type known in the art, an intervening layer material of a type known in the art, etc. Moreover, any intervening layer between the heat spreader plate 302 and circuit board 402, e.g. at the location of the portion extending generally orthogonally from the body of the heat spreader plate 302, may be considered part of the circuit board.

According to various embodiments, the intervening layer may act as a conducting material to promote the direct thermal communication between the portion extending generally orthogonally from the body of the heat spreader plate 302 and the circuit board 402.

The circuit board 402 may also have an aperture 406 therethrough, where the conducting pad 320 extends through the aperture 406 of the circuit board 406. The aperture 406 may allow the conducting pad 320 to span through the circuit board 402 to an additional heat removal component, e.g., such as heat sink 408.

The heat sink 408 may be adjacent the aperture 406 of the circuit board 402, where the conducting pad 320 is in direct thermal communication with the heat sink. For example, the conducting pad 320 may extend along and be in direct thermal communication with a surface of the heat sink 408 in a direction generally perpendicular to the body of the heat spreader plate 302. The portion 324 of the conducting pad 320 may additionally or alternatively be in direct thermal communication with a surface of the heat sink 408 in a direction generally orthogonal to the body of the heat spreader plate 302.

The heat sink 408 may advantageously provide a passive heat exchange with the conducting pad 320 to further dissipate heat away from the connector 300. For example, according to various embodiments, the heat sink 408 may receive heat from the conducting pad 320 and then conduct that heat to a base pan 410. The base pan 410 may further spread and/or dissipate heat that originated from the connector and/or heat from the system surrounding connector 300. The base pan may include, e.g., sheet metal, aluminum, a base pan material of a type known in the art, a rack component, etc. Heat that is spread from the connector 300, as far as heat sink 408 and/or the base pan 410, may significantly decrease the temperature of the connector 300 and or electronic device coupled thereto.

Bussing heat from the heat spreader plate 302 to a location, e.g., the heat sink 408, the base pan 410, the circuit board 402, etc., that is located away from the connector 300, may increase pitch and power density capabilities of the connector 300, due to the connector not having to dedicate a substantial volume to heat displacement components.

With continued reference to system 400, a thermal insulating layer 404 may separate portions of the circuit board 402 and the base pan 410. The insulating layer 404 may advantageously prevent heat that has reached the base pan 410 from spreading and/or radiating back towards the connector 300. Illustrative materials that may be used as or in thermal insulating layers include metallic foils, fiberglass, baffles, etc.

Figure 5:
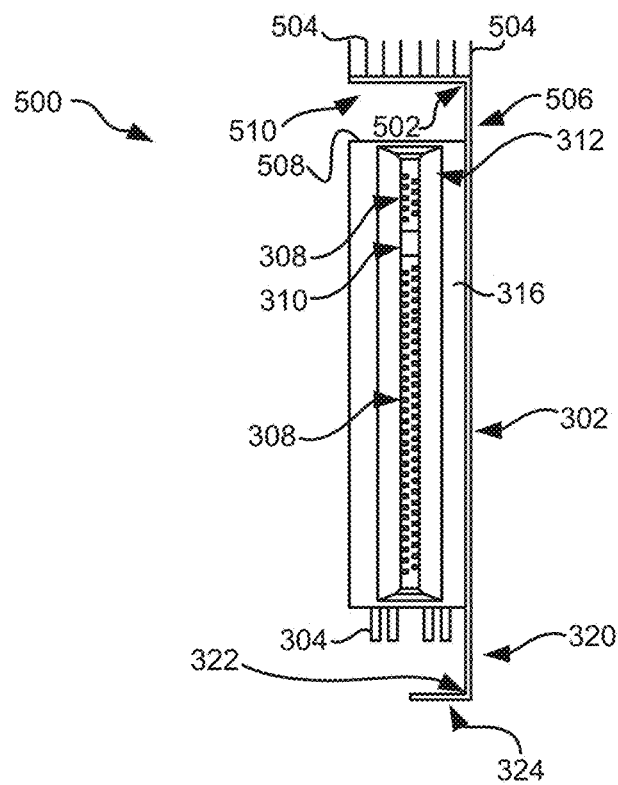
FIG. 5 is a front view of a connector with a heat spreader, in accordance with one embodiment.

FIG. 5 depicts a connector 500 in accordance with one embodiment. As an option, the present connector 500 may be implemented in conjunction with features from any other embodiment listed herein, such as those described with reference to the other FIGS. Of course, however, such connector 500 and others presented herein may be used in various applications and/or in permutations which may or may not be specifically described in the illustrative embodiments listed herein. Further, the connector 500 presented herein may be used in any desired environment.

Connector 500 may include a sidewall 508 extending between the first and second ends 314, 316 and lying in a plane extending along the leads 326 (leads not shown in FIG. 5). Connector 500 may also include the heat spreader plate 302 extending along the leads 326 between the first and second ends 314, 316.

The heat spreader plate 302 may have a conducting pad 506 extending beyond the sidewall 508, or equivalently, beyond a periphery of the connector body. The conducting pad 506 extending beyond the sidewall 508 may serve as a conducting thermal pathway for transferring heat from the heat spreader plate 302 to an area away from the connector 300, e.g. an area beyond the sidewall 508.

The conducting pad 506 may include an orthogonal elbow 502 defining a portion 510 of the conducting pad 506 extending generally orthogonally from a body of the heat spreader plate 302. The portion 510 of the conducting pad 506 extending generally orthogonally from a body of the heat spreader plate 302 may include fins 504 coupled thereto. The fins 504 may desirably increase the surface area by which to dissipate heat by convection, and thereby decrease the temperature of the connector 500.

Figure 6:
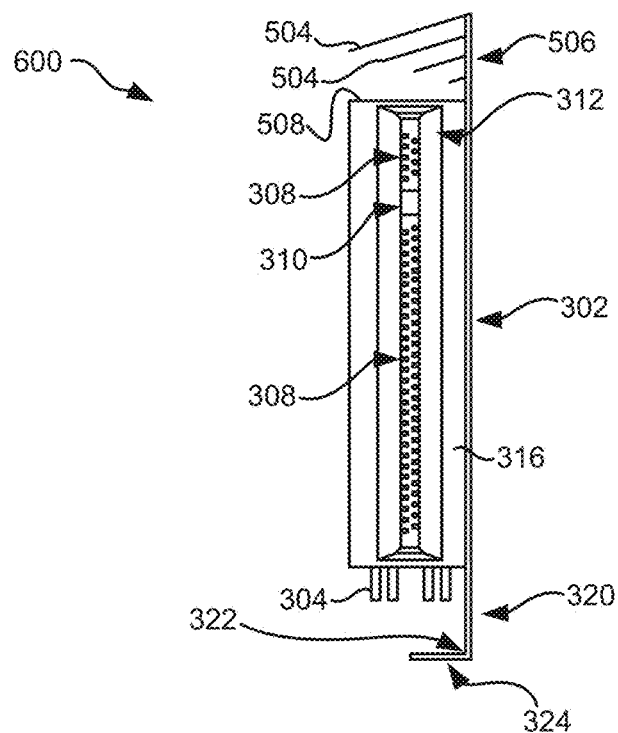
FIG. 6 is a front view of a connector with a heat spreader, in accordance with one embodiment.

FIG. 6 depicts a connector 600 in accordance with one embodiment. As an option, the present connector 600 may be implemented in conjunction with features from any other embodiment listed herein, such as those described with reference to the other FIGS. Of course, however, such connector 600 and others presented herein may be used in various applications and/or in permutations which may or may not be specifically described in the illustrative embodiments listed herein. Further, the connector 600 presented herein may be used in any desired environment.

Connector 600 is similar to connector 500, but differs by the conducting pad 506 including fins 504 coupled thereto.

According to further embodiments, a connector may include both the portion 510 with fins 504 as in FIG. 5, and the fins 504 coupled to the conducting pad 506 as in FIG. 6.

Decreasing temperatures of connectors described herein, e.g., internal temperatures, external temperatures, temperatures of the system surrounding the connectors, etc. may be especially beneficial in card edge connectors with compact design densities, as will be further detailed below by systems with multiple connectors 300 on the same circuit board 402.

Figure 7A:
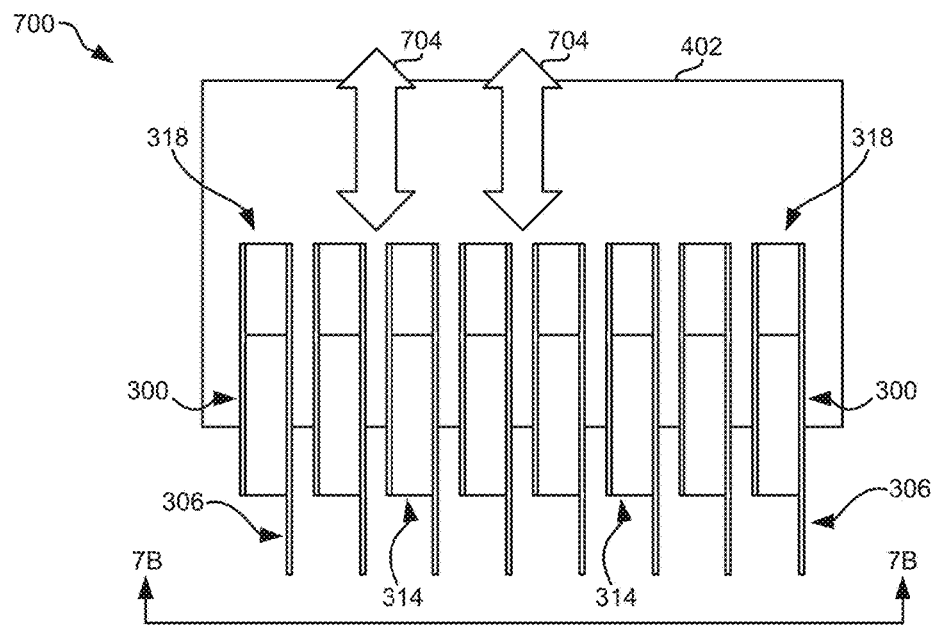
FIG. 7A is a top view of connectors with heat spreaders, and a circuit device, in accordance with one embodiment.
Figure 7B:
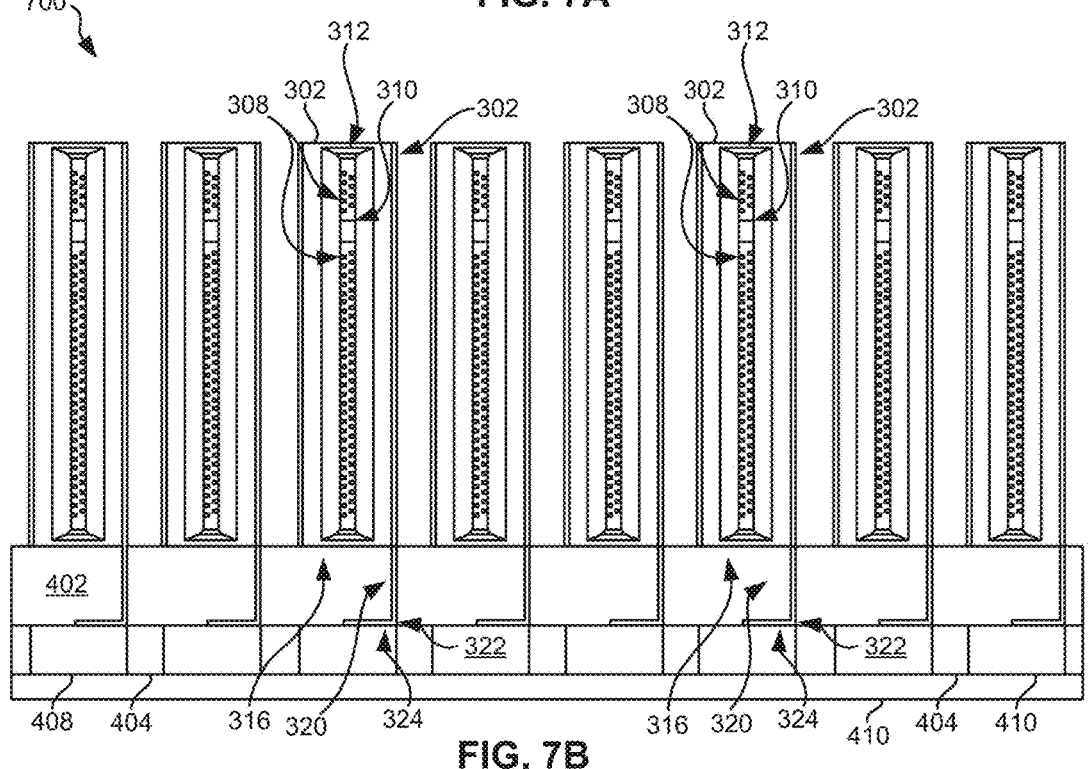
FIG. 7B is an enlarged, detailed side view of the connectors with heat spreaders, and the circuit device of FIG. 7A taken along line 7B-7B, in accordance with one embodiment.

FIGS. 7A-7B depict a system 700 in accordance with one embodiment. As an option, the present system 700 may be implemented in conjunction with features from any other embodiment listed herein, such as those described with reference to the other FIGS. Of course, however, such system 700 and others presented herein may be used in various applications and/or in permutations which may or may not be specifically described in the illustrative embodiments listed herein. Further, the system 700 presented herein may be used in any desired environment.

System 700 includes a plurality of connectors 300. As previously described, various embodiments described herein may include one or a plurality of connectors 300 depending on the preferred embodiment, e.g., two connectors 300, eight connectors 300 in system 700 for purposes of this example, twelve connectors 300, etc. In preferred approaches, system 700 may include a preferred range of 2-12 connectors 300, but may vary depending on the preferred embodiment.

With continued reference to FIG. 7A, system 700 further may include a fan (not shown) for inducing air flow across the connectors 300 in a direction 704 parallel to the first end 314. The connectors 300 may furthermore be spaced apart from one another in a direction orthogonal to direction 704 to promote cooling of system 700, e.g., in order to cool system 700 from heat that may be generated during system 700 function, in order to prevent asperities (e.g. dust, etc.) from building up in system 700, etc. For example, closest facing portions of at least some of the connectors may be spaced apart by a distance sufficient to allow substantially uninhibited airflow therebetween in a direction parallel to the first end, e.g., the airflow between the adjacent connectors is volumetrically reduced by less than 20%. Inducing air flow across the connectors 300 in a direction 704 parallel to the first end 314 may not otherwise be possible and/or as efficient in conventional card edge connection layouts with condensed vertical backplane connections.

FIG. 7B is a detailed side view of system 700 of FIG. 7A taken along line 7B-7B. It should be noted that the connectors 300 of FIG. 7B are illustrated as being larger in size than the connectors 300 were in FIG. 7A for the purposes of showing detail of the second end 316. It should be further noted that the spatial configurations, e.g., the spacing between each of the connectors 300, the spacing between the outermost connectors and the edge of the circuit board 402, etc., of connectors 300 may vary depending on the preferred embodiment.

Figure 8A:
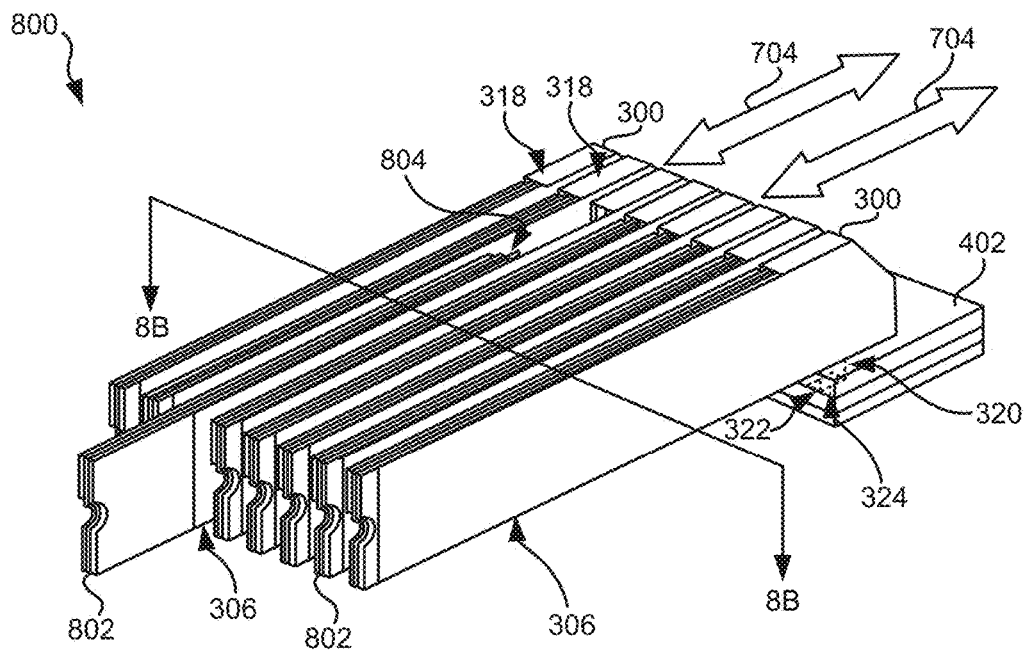
FIG. 8A is a perspective view of electronic devices attached to connectors with heat spreaders, and a circuit device, in accordance with one embodiment.
Figure 8B:
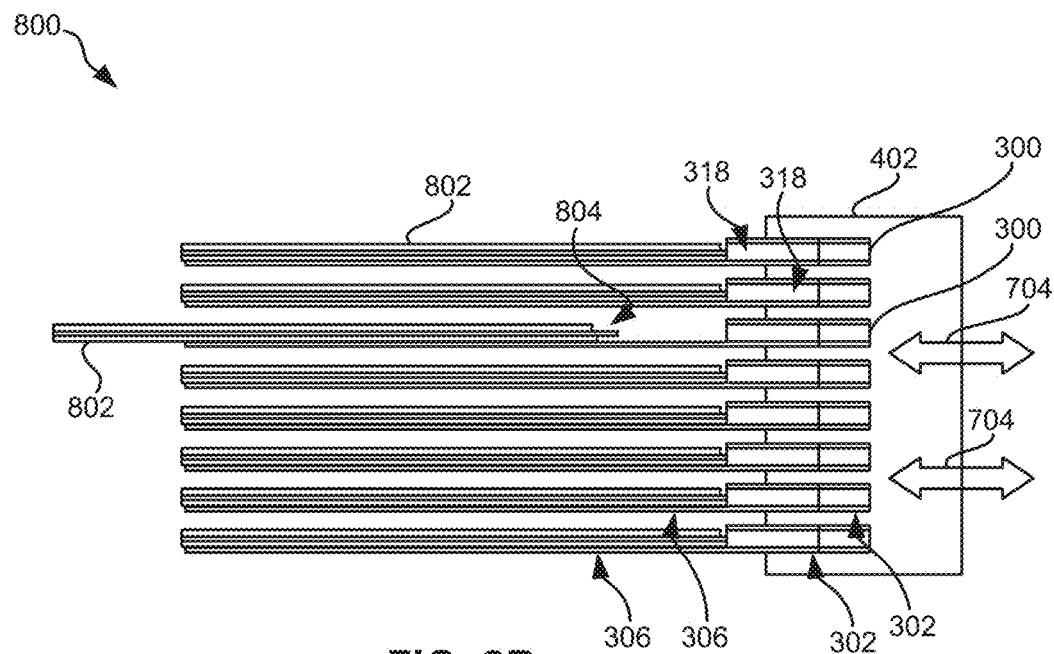
FIG. 8B is a top view of the electronic devices attached to the connectors with heat spreaders, and the circuit device of FIG. 8A taken along line 8B-8B, in accordance with one embodiment.

FIGS. 8A-8B depict a system 800 in accordance with one embodiment. As an option, the present system 800 may be implemented in conjunction with features from any other embodiment listed herein, such as those described with reference to the other FIGS. Of course, however, such system 800 and others presented herein may be used in various applications and/or in permutations which may or may not be specifically described in the illustrative embodiments listed herein. Further, the system 800 presented herein may be used in any desired environment.

FIG. 8A is perspective view of the system 800. System 800 includes connectors 300 and circuit board 402. System 800 further includes a plurality of electronic devices 802 each having a card edge 804 coupled to the second end 316 of a respective one of the connectors 300. The electronic devices 802 may be any type of electronic devices, e.g., such as memory cards, data processing cards, electronic devices of a type known in the art, etc. Furthermore, each of the electronic devices 802 of system 800 may differ from one another, e.g., differ in size, differ in functionality, differ in how each card is coupled to the second end 316 of a respective one of the connectors 300, etc. depending on the embodiment.

It should be noted that connectors 300 in system 800 are illustrated as being coupled to a single corresponding electronic device 802. In other embodiments, more than one electronic device 802 may be coupled to one or more of the connectors 300, e.g., when the connectors are designed accordingly, when the circuit board is designed to accept such a connector, etc.

The coupling between each of the card edges 804 of the plurality of electronic devices 802 and the respective connectors 300 may be uncoupled by various actions. For example, the coupling between each of the card edges 804 of the plurality of electronic devices 802 and the respective connectors 300 may be uncoupled. e.g., by a user and/or accessor pulling out the electronic device 802 in a direction substantially similar to a direction in which the electronic devices 802 are inserted for coupling with the first contacts 304.

The system 800 may include a fan (not shown) for inducing air flow across the connectors 300 in a direction 704. The connectors 300 and/or the electronic devices 802 may be spaced apart from one another in a direction orthogonal to direction 704 to promote cooling of system 800, e.g., in order to remove heat from system 800 that may be generated during system 800 operation, in order to prevent asperities (e.g. dust, etc.) from building up in system 800, etc.

Orthogonal card edge connection layouts described herein may maintain the density of a card to board connection when the pitch between the cards is increased for cooling purposes. For example, when implemented in one or more spinning drive bays of a computer, this maintained density may be especially appealing to consumer spatial demands. This benefit may be not possible in conventional card edge connection layouts, e.g., vertical card edge connection layouts, etc.

FIG. 8B is a top down view of the electronic devices 802 attached to the connectors 300 and the circuit board 402 of FIG. 8A taken along line 8B-8B.

It should be noted that the illustrative system 800 shown includes eight connectors 300 with eight corresponding electronic devices for example purposes. Further embodiments may include more or fewer connectors 300 and/or electronic devices 802 of varying configurations. For example in a further embodiment, a circuit board may include sixteen connectors 300 with only ten of the connectors 300 coupled to a corresponding electronic device 802, e.g., where the remaining six uncoupled connectors 300 may later be filled by a user when more flash memory is desired, where the six uncoupled connectors and the ten coupled connectors are staggered to provide more spatial spreading between the connectors to further promote the cooling of system 800, etc.

Figure 9:
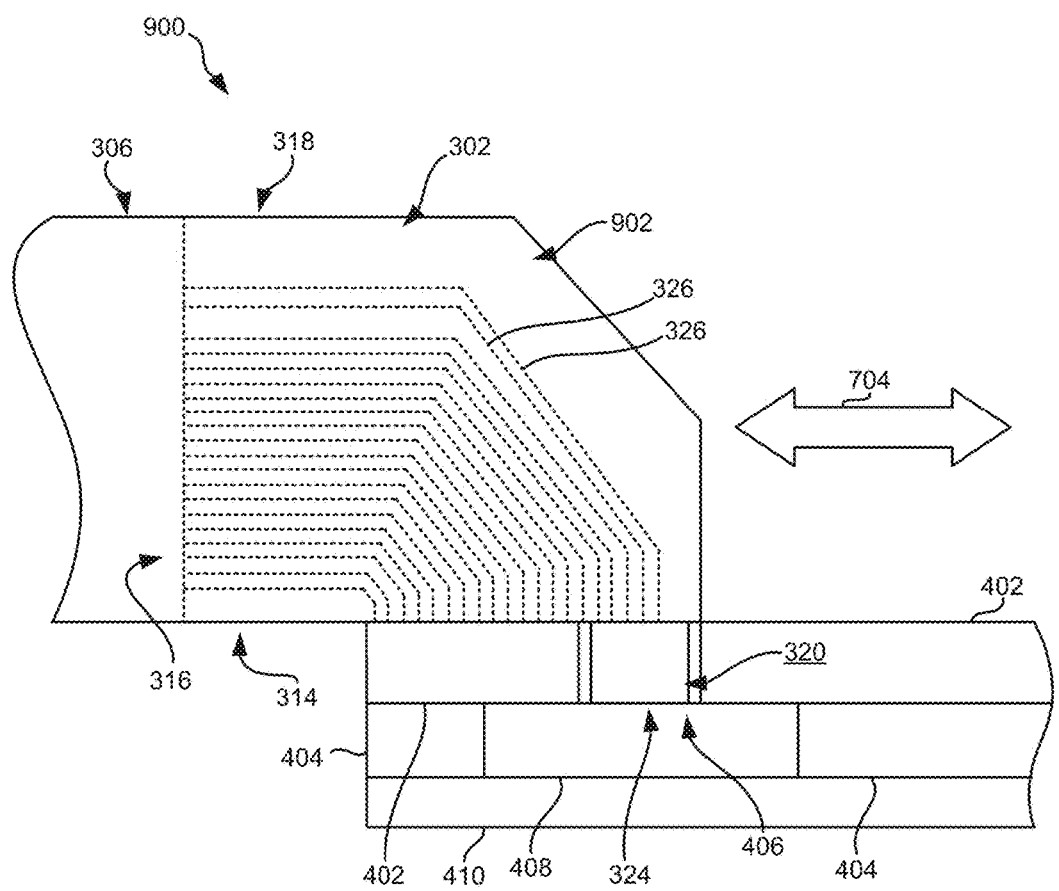
FIG. 9 is a side view of a connector with a heat spreader, and a circuit device, in accordance with one embodiment.

FIG. 9 depicts a system 900 in accordance with one embodiment. As an option, the present system 900 may be implemented in conjunction with features from any other embodiment listed herein, such as those described with reference to the other FIGS. Of course, however, such system 900 and others presented herein may be used in various applications and/or in permutations which may or may not be specifically described in the illustrative embodiments listed herein. Further, the system 900 presented herein may be used in any desired environment.

FIG. 9 is a detailed side view of a connector 902. Connector 902 is similar to connector 300 described herein, but furthermore includes a portion of the connector 902 residing past the outermost edge of the circuit board 402. Accordingly, portions of the heat spreader plate 302, e.g., the portion 324, the heat spreader plate 302, the conducting pad 320, etc. may be fixed to a portion of the connector 902 that differs from the location of the portions of the heat spreader plate 302 components on connector 300.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
    a first end having a plurality of first contacts configured for coupling with a circuit device;
    a second end having a plurality of second contacts configured for coupling directly with a card edge of an electronic device;
    a plurality of leads extending between the first and second contacts; and
    a heat spreader plate extending along the leads between the first and second ends,
    the heat spreader plate having at least one of: a conducting pad extending beyond the first end and a conducting pad extending beyond the second end.

2. The system as recited in claim 1, wherein the conducting pad includes an orthogonal elbow defining a portion of the conducting pad extending generally orthogonally from a plane of a body of the heat spreader plate in a direction toward the first contacts.

3. The system as recited in claim 1, wherein the second end is oriented about orthogonal to the first end, wherein the second end has the plurality of second contacts arranged in a plurality of linear arrays positioned in a single contiguous slot.

4. The system as recited in claim 1, wherein the heat spreader plate has the conducting pad extending beyond the first end.

5. The system as recited in claim 4, comprising a circuit board, wherein the heat spreader plate lies primarily along a plane, wherein the conducting pad has a portion extending in a direction generally orthogonally to the plane of the heat spreader plate and is in direct thermal communication with the circuit board, for conducting heat from the body of the heat spreader plate to the circuit board.

6. The system as recited in claim 4, comprising a circuit board having an aperture therethrough, wherein the conducting pad extends through the aperture of the circuit board, wherein the conducting pad includes an orthogonal elbow on an opposite side of the circuit board as the first end.

7. The system as recited in claim 6, comprising a heat sink adjacent the aperture of the circuit board, wherein a distal end of the conducting pad extending from the orthogonal elbow is in direct thermal communication with the heat sink.

8. The system as recited in claim 1, wherein the leads lie along a substrate, wherein the heat spreader plate has the conducting pad extending beyond the second end for a distance that is greater than a maximum length of the substrate measured in a direction parallel to the first end.

9. The system as recited in claim 1, wherein the heat spreader plate has the conducting pad extending beyond the second end, wherein the conducting pad is physically configured to extend along and physically engage an outer-facing surface of an electronic component coupled to the second end.

10. The system as recited in claim 1, wherein the leads lie along a substrate, wherein sides of the leads facing away from the substrate are exposed, wherein the heat spreader plate is spaced from the exposed sides of the leads; and comprising at least one ground plane extending generally parallel to the leads.

11. A system, comprising:
a first end having a plurality of first contacts configured for coupling with a circuit device;
a second end having a plurality of second contacts configured for coupling directly with a card edge of an electronic device;
a plurality of leads extending between the first and second contacts; and
a heat spreader plate extending along the leads between the first and second ends,
the heat spreader plate having a conducting pad having an orthogonal elbow defining a portion of the conducting pad extending generally orthogonally from a body of the heat spreader to a location under the first end.

12. The system as recited in claim 11, wherein the portion of the conducting pad extending generally orthogonally from the body of the heat spreader plate is about coextensive with the first end.

13. The system as recited in claim 11, wherein the second end is oriented about orthogonal to the first end, wherein the second end has the plurality of second contacts arranged in a plurality of linear arrays positioned in a single contiguous slot.

14. The system as recited in claim 11, wherein portions of all of the leads extend along a common plane; and comprising at least one ground plane extending generally parallel to the leads.

15. The system as recited in claim 11, wherein the leads lie along a substrate, wherein sides of the leads facing away from the substrate are exposed, wherein the heat spreader plate is spaced from the exposed sides of the leads, wherein the heat spreader plate has a second conducting pad extending beyond the second end for a distance that is greater than a maximum length of the substrate measured in a direction parallel to the first end.

16. The system as recited in claim 11, comprising a circuit board, wherein the portion of the conducting pad extending generally orthogonally from the body of the heat spreader plate is in direct thermal communication with the circuit board, for conducting heat from the body of the heat spreader plate to the circuit board.

17. A system, comprising:
a first end having a plurality of first contacts configured for coupling with a circuit device;
a second end having a plurality of second contacts configured for coupling directly with a card edge of an electronic device;
a plurality of leads extending between the first and second contacts;
a sidewall extending between the first and second ends and lying in a plane extending along the leads, wherein the sidewall extends beyond the second contacts; and
a heat spreader plate extending along the leads between the first and second ends,
the heat spreader plate having a conducting pad extending beyond the sidewall.

18. The system as recited in claim 17, wherein the conducting pad includes an orthogonal elbow defining a portion of the conducting pad extending generally orthogonally from a plane of a body of the heat spreader plate in a direction toward the first contacts.

19. The system as recited in claim 18, wherein the portion of the conducting pad extending generally orthogonally from a body of the heat spreader plate has fins coupled thereto.

20. The system as recited in claim 17, wherein the conducting pad has fins coupled thereto.

* * * * *